United States Patent [19]

Lieux

[11] 4,283,673
[45] Aug. 11, 1981

[54] MEANS FOR REDUCING CURRENT-GAIN MODULATION DUE TO DIFFERENCES IN COLLECTOR-BASE VOLTAGES ON A TRANSISTOR PAIR

[75] Inventor: J. Darryl Lieux, San Jose, Calif.

[73] Assignee: Signetics Corporation, Sunnyvale, Calif.

[21] Appl. No.: 105,418

[22] Filed: Dec. 19, 1979

[51] Int. Cl.³ .............................................. G05F 1/56
[52] U.S. Cl. ..................................... 323/316; 323/267
[58] Field of Search ........................... 323/1, 4, 9, 19; 330/296, 297; 307/33, 34

[56] References Cited

U.S. PATENT DOCUMENTS

| | | | |
|---|---|---|---|
| 3,510,695 | 5/1970 | Lauper | 323/1 |
| 3,925,718 | 12/1975 | Wittlinger | 323/4 |
| 4,087,758 | 5/1978 | Hareyama | 323/19 |
| 4,150,309 | 4/1979 | Tokuda | 323/19 |
| 4,177,417 | 12/1979 | Henry et al. | 323/19 |

Primary Examiner—William H. Beha, Jr.
Attorney, Agent, or Firm—Jerry A. Dinardo; Thomas A. Briody; Jack Oisher

[57] ABSTRACT

In a circuit including a transistor pair feeding separate loads at different load voltages, current gain modulation or Early effect is avoided by employing an operational amplifier to maintain the collector-base voltages of the transistors equal and thereby maintain their alpha current gains equal.

4 Claims, 2 Drawing Figures

MEANS FOR REDUCING CURRENT-GAIN MODULATION DUE TO DIFFERENCES IN COLLECTOR-BASE VOLTAGES ON A TRANSISTOR PAIR

BACKGROUND OF THE INVENTION

This invention relates to circuits using a transistor pair and more particularly to improvements designed to reduce current-gain modulation arising from differences in the collector-base voltages of the two transistors.

Some high precision circuits that use transistor pairs operating at high voltages often suffer from what is termed current-gain modulation. This is also known as Early effect. When the collector-base voltage of a transistor changes, for example, due to varying load conditions, the current gain, particularly the alpha, changes, as does the base emitter voltage that is required to produce a particular current. When two such transistors are operated in a current mirror configuration where the two load currents should always be equal and track each other, such operation is difficult to achieve, particularly where the two transistors operate with different base-collector voltages.

SUMMARY OF THE INVENTION

The invention is particularly directed to improvements in transistor circuits of the kind in which a pair of transistors having their bases connected in common are fed substantially equal constant currents in their respective emitter paths. A load is coupled separately to each collector of the transistors.

In accordance with the invention, means are provided for maintaining the collector-base voltages of the two transistors equal, thereby maintaining their current gains (alpha) equal at all times even under conditions of varying load. In a specific embodiment of the invention, an operational amplifier is coupled between the collectors of the two transistors with current feedback to the collector of the transistor normally having the higher collector-base voltage.

DESCRIPTION OF THE PREFERRED EMBODIMENT

Figure 1:
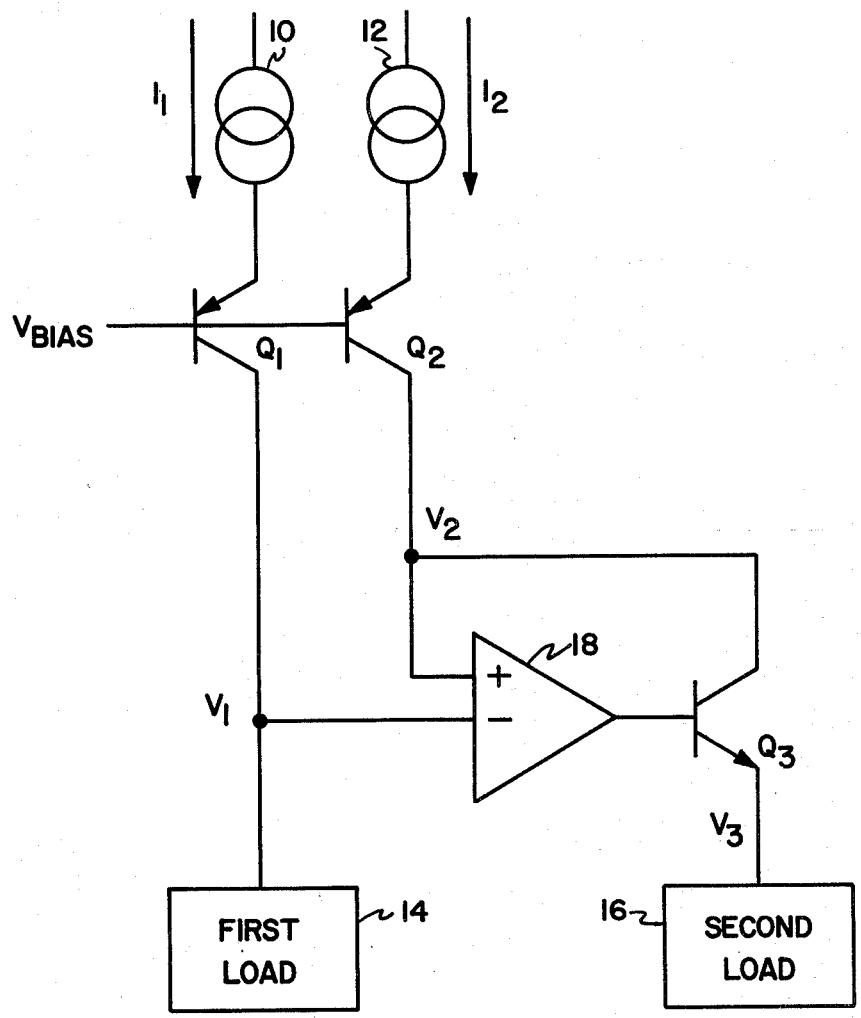
FIG. 1 is a block diagram showing the circuit according to the invention.

In FIG. 1 a pair of PNP transistors $Q_1$ and $Q_2$ have their bases connected in common to a bias supply $V_{BIAS}$. A first constant current source 10 is connected in the emitter circuit of the first transistor $Q_1$ providing a first current $I_1$. A second constant current source 12 is connected in the emitter circuit of the second transistor $Q_2$ providing a second current $I_2$. The two currents $I_1$ and $I_2$ are equal.

A first load 14 is connected in the output collector circuit of the first transistor $Q_1$, and a second load 16 is connected in the output collector circuit of the second transistor $Q_2$. The second load voltage $V_3$ is assumed to be more negative than the first load voltage $V_1$. Under these conditions and in the absence of the invention the voltage $V_2$ at the collector of the second transistor $Q_2$ would be greater than the voltage $V_1$ at the collector of the first transistor $Q_2$, the two base voltages being equal. Since the transistors $Q_1$ and $Q_2$ would have different collector-base voltages, they would also have different alpha current gains, thereby giving rise to the current gain modulation effects already discussed.

In order to overcome these objectional effects, an operational amplifier 18 is connected to the collector outputs of the transistors $Q_1$ and $Q_2$ and the output of the amplifier 18 is fed back to the collector of the second transistor $Q_2$, which has the higher collector-base voltage $V_{cb}$. In particular, the collector of the first transistor $Q_1$ is coupled to the inverting or negative input of the amplifier 18, and the collector of the second transistor $Q_2$ is coupled to the non-inverting or positive input. The output of the operational amplifier 18, is coupled to the base of the buffer amplifier $Q_3$, the emitter of which is coupled to the second load 16, and the collector of which is coupled to the collector of the second transistor $Q_2$.

The operational amplifier 18 serves to maintain the collector voltages $V_1$ and $V_2$ equal and thus equalizes the respective current gains (alpha). Thus even though the base collector voltages and current gains may vary, the amplifier 18 forces them to track each other and keep them equal.

The collector current of the buffer amplifier $Q_3$ will be equal to the current in the collector of the second transistor $Q_2$ since the input bias current of the operational amplifier can be made so small as to be negligible. The emitter current of the buffer amplifier $Q_3$ will differ from its collector current, but the so-called early effect of an NPN transistor such as $Q_3$ is much less than that of a PNP transistor such as $Q_2$. The overall effect of this circuit arrangement is that the output current fed to the second load 16 from the emitter of the buffer amplifier $Q_3$ is independent of the second load voltage $V_3$.

Figure 2:
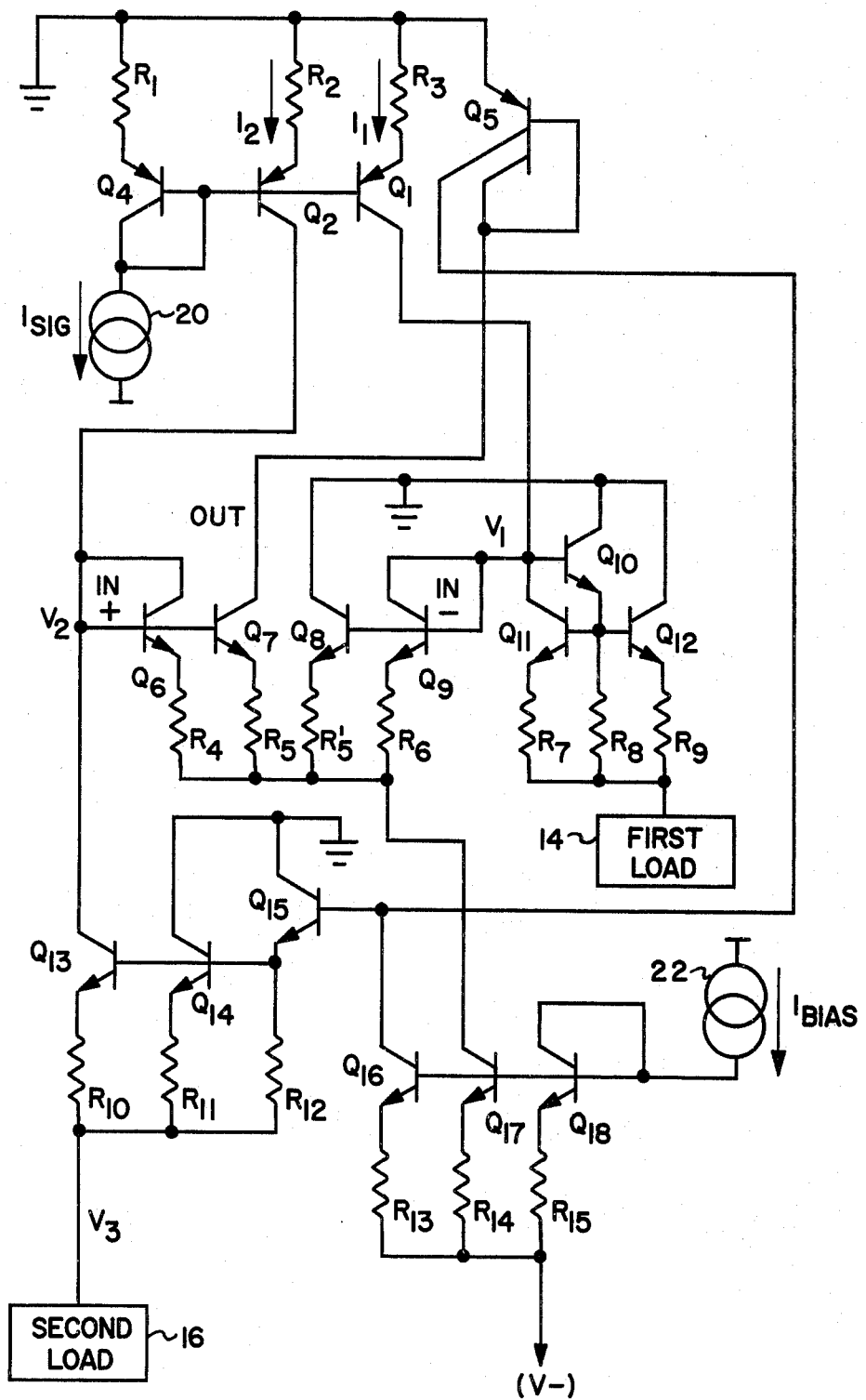
FIG. 2 is a schematic diagram showing the circuit of the invention in greater detail.

FIG. 2 is a schematic diagram showing the circuit of the invention in greater detail. An input control current $I_{SIG}$ from a current generator 20 is fed to a PNP bias transistor $Q_4$ and emitter resistor $R_1$. The voltage on the base of the bias transistor $Q_4$ provides the bias for the PNP transistors $Q_1$ and $Q_2$, whose bases are connected in common with the base and collector of transistor $Q_4$. The equal emitter currents $I_1$ and $I_2$ of transistors $Q_1$ and $Q_2$ flow through emitter resistors $R_3$ and $R_2$ respectively.

The output of first transistor $Q_1$ is fed to a buffer amplifier consisting of three NPN transistors $Q_{10}$, $Q_{11}$, $Q_{12}$ to provide the high output current by the first load 14. The bases of transistors $Q_{11}$ and $Q_{12}$ are connected together and to the emitter of buffer transistor $Q_{10}$. The emitters of transistors $Q_{10}$, $Q_{11}$ and $Q_{12}$ are coupled through resistors $R_8$, $R_7$ and $R_9$ to the first load 14. The collectors of transistors $Q_{10}$ and $Q_{12}$ are connected together and to ground. The base of transistor $Q_{10}$ and the collector of transistor $Q_{11}$ are coupled to the collector of the first transistor $Q_1$ to receive the collector current of the first transistor, the voltage $V_1$ at that point being the collector voltage of the first transistor $Q_1$.

In the buffer amplifier the majority of the output current of the first transistor $Q_1$ is sunk by transistor $Q_{11}$ and resistor $R_7$. The voltage on the base of $Q_{11}$ provides bias to the high current transistor $Q_{12}$. This causes the majority of the current in the output current mirror, which consists of transistors $Q_{10}$, $Q_{11}$ and $Q_{12}$, to flow through transistor $Q_{12}$ and resistor $R_9$. The buffer transistor $Q_{10}$ serves to keep the base current of transistors $Q_{11}$ and $Q_{12}$ from loading the collector current of the first transistor $Q_1$.

The collector outputs of the transistor pair $Q_1$ and $Q_2$ are coupled to transistors $Q_9$ and $Q_6$, respectively, which at their respective inputs have their bases and collectors connected together. The transistors $Q_9$ and $Q_6$ provide the differential input for the operational amplifier 18 shown in FIG. 1. Transistor $Q_9$ provides the negative or inverting input, and transistor $Q_6$ provides the positive or non-inverting input. The output of the operational amplifier is taken from the collector current of a transistor $Q_7$, whose base is connected to the base of transistor $Q_6$ which is the positive input. A transistor $Q_8$ having its base connected to the base of transistor $Q_9$, which is the negative input, serves as a balancing transistor. Resistors $R_4$, $R_5$, $R_5'$ and $R_6$ are coupled from a common connection to the respective emitters of transistors $Q_6$, $Q_7$, $Q_8$ and $Q_9$ and provide emitter ballasting.

Three transistors $Q_{16}$, $Q_{17}$ and $Q_{18}$ provide bias current to the operational amplifier. A current source 22 supplies bias current to the common bases of the transistors $Q_{16}$, $Q_{17}$, $Q_{18}$. Resistors $R_{13}$, $R_{14}$, $R_{15}$ connect the respective emitters of the transistors $Q_{16}$, $Q_{17}$, $Q_{18}$ to a source of potential, such as a battery, which in the case of the NPN transistors is a negative supply.

The equivalent of the buffer amplifier $Q_3$ of FIG. 1 is provided by three transistors $Q_{13}$, $Q_{14}$, $Q_{15}$. Resistors $R_{10}$, $R_{11}$ and $R_{12}$ couple the respective emitters of the transistors $Q_{13}$, $Q_{14}$, $Q_{15}$ to the second load 16.

The output collector current of the transistor $Q_7$ of the operational amplifier is coupled to one collector and base of a PNP transistor $Q_5$, which serves as a level shifter; that is, by means of transistor $Q_5$, the positive voltage at the collector of transistor $Q_7$ is shifted down to the negative voltage at the base of transistor $Q_{15}$ and the collector of transistor $Q_{16}$. The collector output of the transistor $Q_5$ in turn drives the base of transistor $Q_{15}$ in the buffer amplifier. The emitter output of transistor $Q_{15}$ in turn drives the bases of the output transistor $Q_{14}$ and the feedback transistor $Q_{13}$. The emitter currents of the output transistor $Q_{14}$ and the feedback transistor $Q_{13}$ are fed to the second load 16. The collector current of the feedback transistor $Q_{13}$ is fed back to the collector of the second transistor $Q_2$ and to the base of transistor $Q_6$, which is the positive input of the operational amplifier.

The collector current of the feedback transistor $Q_{13}$ is approximately equal to the collector current of the second transistor $Q_2$. More importantly, the voltage $V_2$ on the collector of the second transistor $Q_2$ is equal to the voltage $V_1$ on the collector of the first transistor $Q_1$, thereby rendering the alpha current gains of the transistors $Q_1$ and $Q_2$ equal and avoiding the Early effect mismatch.

What is claimed is:

1. A transistor circuit, comprising:
   (a) a pair of transistors each having an emitter, base and collector, with their bases connected in common,
   (b) current supply means for supplying substantially equal current to the emitters of said transistors,
   (c) a load coupled separately to each collector of said transistors, and
   (d) means coupled between the collectors of said transistors and between the collector of one of said transistors and the load coupled thereto for maintaining the collector-base voltages of said transistors substantially equal and their current gains substantially equal.

2. The invention according to claim 1, wherein the means in (d) comprises an operational amplifier having its separate inputs coupled to the respective collectors of said transistors and its output coupled to one of said loads and to the collector of the transistor feeding said one load.

3. The invention according to claim 2, wherein the output of said operational amplifier is coupled to the collector of the transistor noramlly having the higher collector-base voltage.

4. The invention according to claim 3, wherein the non-inverting input of said operational amplifier is coupled to the collector of said one transistor and the inverting input thereof is coupled to the other transistor.

* * * * *